(12) United States Patent
Konda

(10) Patent No.: US 9,370,131 B2
(45) Date of Patent: Jun. 14, 2016

(54) SURFACE MOUNT CLIP

(75) Inventor: Kenji Konda, Nagoya (JP)

(73) Assignee: KITAGAWA INDUSTRIES CO., LTD., Inazawa-Shi, Aichi (JP)

( * ) Notice: Subject to any disclaimer, the term of this patent is extended or adjusted under 35 U.S.C. 154(b) by 0 days.

(21) Appl. No.: 13/504,633

(22) PCT Filed: Nov. 5, 2010

(86) PCT No.: PCT/JP2010/069743
§ 371 (c)(1),
(2), (4) Date: Apr. 27, 2012

(87) PCT Pub. No.: WO2011/055798
PCT Pub. Date: May 12, 2011

(65) Prior Publication Data
US 2012/0217365 A1 Aug. 30, 2012

(30) Foreign Application Priority Data

Nov. 6, 2009 (JP) .................................. 2009-255166

(51) Int. Cl.
*A47G 1/10* (2006.01)
*H05K 9/00* (2006.01)
*H05K 7/14* (2006.01)

(52) U.S. Cl.
CPC ................ *H05K 9/0022* (2013.01); *H05K 7/14* (2013.01)

(58) Field of Classification Search
CPC ..... H05K 9/0022; H05K 7/14; H05K 7/1405; H05K 9/0016; H05K 7/12; H01R 11/22; H01R 13/6582; H01R 13/6583; H09K 9/0035
USPC .................. 248/316.7, 74.2, 74.1, 74.3, 27.3, 248/229.16, 229.26, 228.7, 231.81; 439/857, 865; 174/138 R, 351, 354; 361/816, 818, 800, 769, 759
See application file for complete search history.

(56) References Cited

U.S. PATENT DOCUMENTS 2,873,082 A * 2/1959 Gillespie ................. F16B 2/241
248/300
3,160,280 A * 12/1964 Burch .................... H02B 1/052
211/26

(Continued)

FOREIGN PATENT DOCUMENTS

| CH | 101242735 A | 8/2008 |
| CN | 1332951 A | 1/2002 |

(Continued)

OTHER PUBLICATIONS

Korean Office Action with English translation for corresponding Korean application (No. 10-2012-7014317) mail dated Jun. 28, 2013.

(Continued)

*Primary Examiner* — Christopher E Garft
(74) *Attorney, Agent, or Firm* — Davis & Bujold PLLC; Michael J. Bujold

(57) ABSTRACT

A surface mount clip includes: a bottom portion having a flat surface; clip spring portions which extend from parts of the bottom portion and are provided in a standing manner, in a pair facing each other so as to form a gap therebetween, and which are configured to clip a plate material inserted into the gap by a resilient repulsive force; and a bottom spring portion which is formed by cutting and raising a part of the bottom portion or the clip spring portions, and which has an upper surface to be pressed by a lower end of the plate material inserted between the pair of the clip spring portions.

16 Claims, 3 Drawing Sheets

(56) References Cited

U.S. PATENT DOCUMENTS

| | | | | |
|---|---|---|---|---|
| 3,279,729 | A | * | 10/1966 | Buttriss .................. 248/27.3 |
| 3,595,402 | A | * | 7/1971 | Smaczny ................. H01R 9/26 |
| | | | | 211/26 |
| 5,545,843 | A | * | 8/1996 | Arvidsson ............ H05K 9/0016 |
| | | | | 174/355 |
| 5,577,268 | A | * | 11/1996 | Ho ....................... H05K 9/0039 |
| | | | | 361/800 |
| 5,792,994 | A | * | 8/1998 | Akahane .................. 174/138 G |
| 5,947,767 | A | * | 9/1999 | Kitamura et al. ............. 439/567 |
| 6,051,781 | A | * | 4/2000 | Bianca ................. H05K 9/0035 |
| | | | | 174/250 |
| 6,267,629 | B1 | * | 7/2001 | Nguyen ............... H05K 9/0035 |
| | | | | 174/354 |
| 6,621,714 | B1 | * | 9/2003 | Li et al. .......................... 361/801 |
| 7,712,708 | B2 | * | 5/2010 | Clark ........................... 248/74.4 |
| 2003/0102786 | A1 | | 6/2003 | Yamamoto et al. |
| 2011/0188226 | A1 | * | 8/2011 | Kim ........................ H05K 9/00 |
| | | | | 361/818 |

FOREIGN PATENT DOCUMENTS

| | | |
|---|---|---|
| CN | 201001255 Y | 1/2008 |
| CN | 101242735 A | 8/2008 |
| JP | 5-327262 A | 12/1993 |
| JP | 2000-196280 A | 7/2000 |
| JP | 2001-284875 A | 10/2001 |
| JP | 2005-332953 A | 12/2005 |
| JP | 2006-100473 A | 4/2006 |
| WO | 00/25563 A1 | 5/2000 |
| WO | 2006/000251 A1 | 1/2006 |
| WO | 2009/025405 A1 | 2/2009 |

OTHER PUBLICATIONS

Japanese Office Action with English translation for corresponding Japanese application.
Notification of Transmittal of Translation of the International Preliminary Report on Patentability, for corresponding PCT application.
International Preliminary Report on Patentability, for corresponding PCT application.
Translation of The Written Opinion Of The International Searching Authority, for corresponding PCT application.
Chinese Office Action Corresponding to 201080049900.5 mailed May 6, 2014 10 pages.
Chinese Office Action with English summary for corresponding Chinese Appln. No. 201080049900.5 mailed Nov. 26, 2014.
Chinese Decision of Rejection and its brief summary in English issued in corresponding Chinese Patent Application No. 201080049900.5 mailed May 21, 2015.
Chinese Reexamination Notification issued in Chinese Patent Application No. 201080049900.5 mailed Feb. 23, 2016.

\* cited by examiner

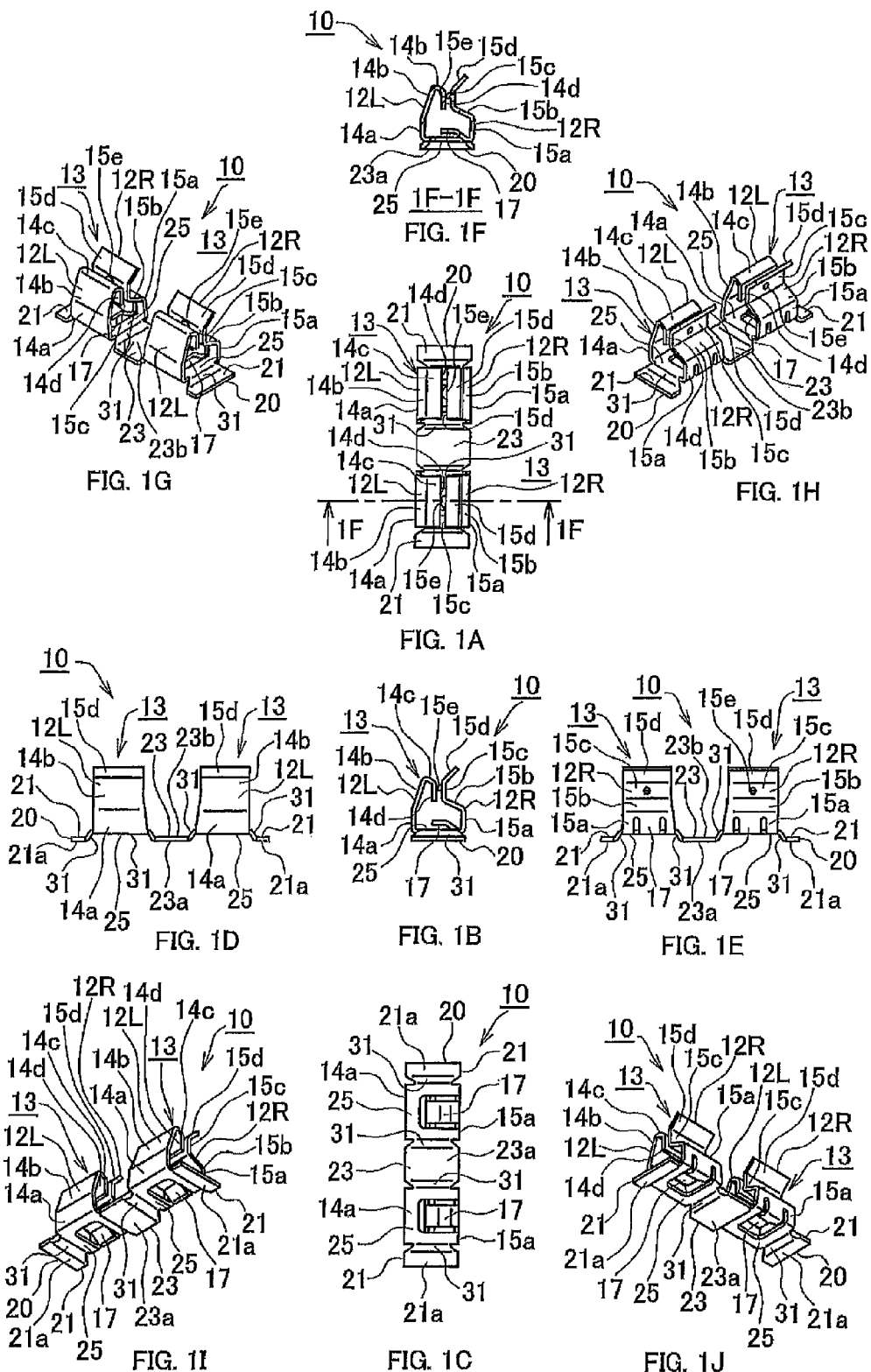

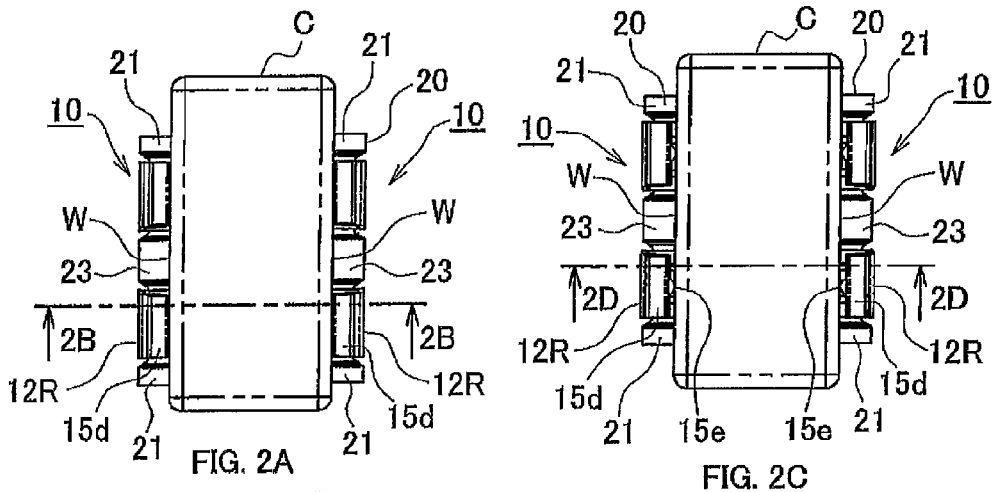
FIG. 2A
FIG. 2C
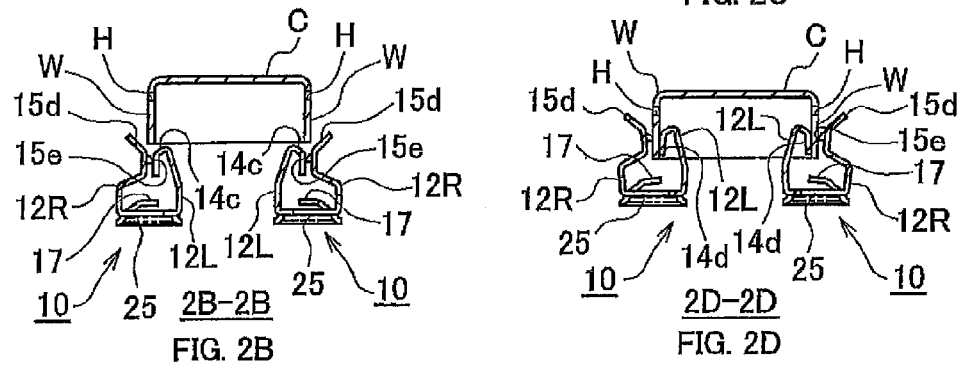
FIG. 2B
FIG. 2D
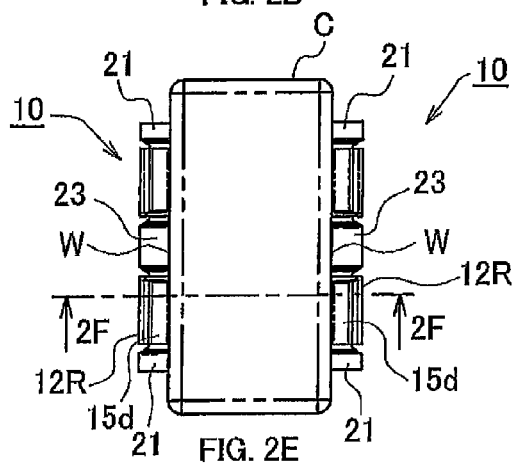
FIG. 2E
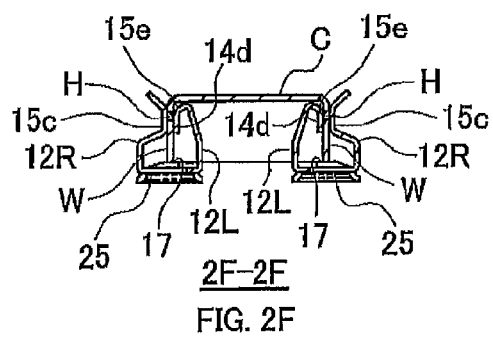
FIG. 2F

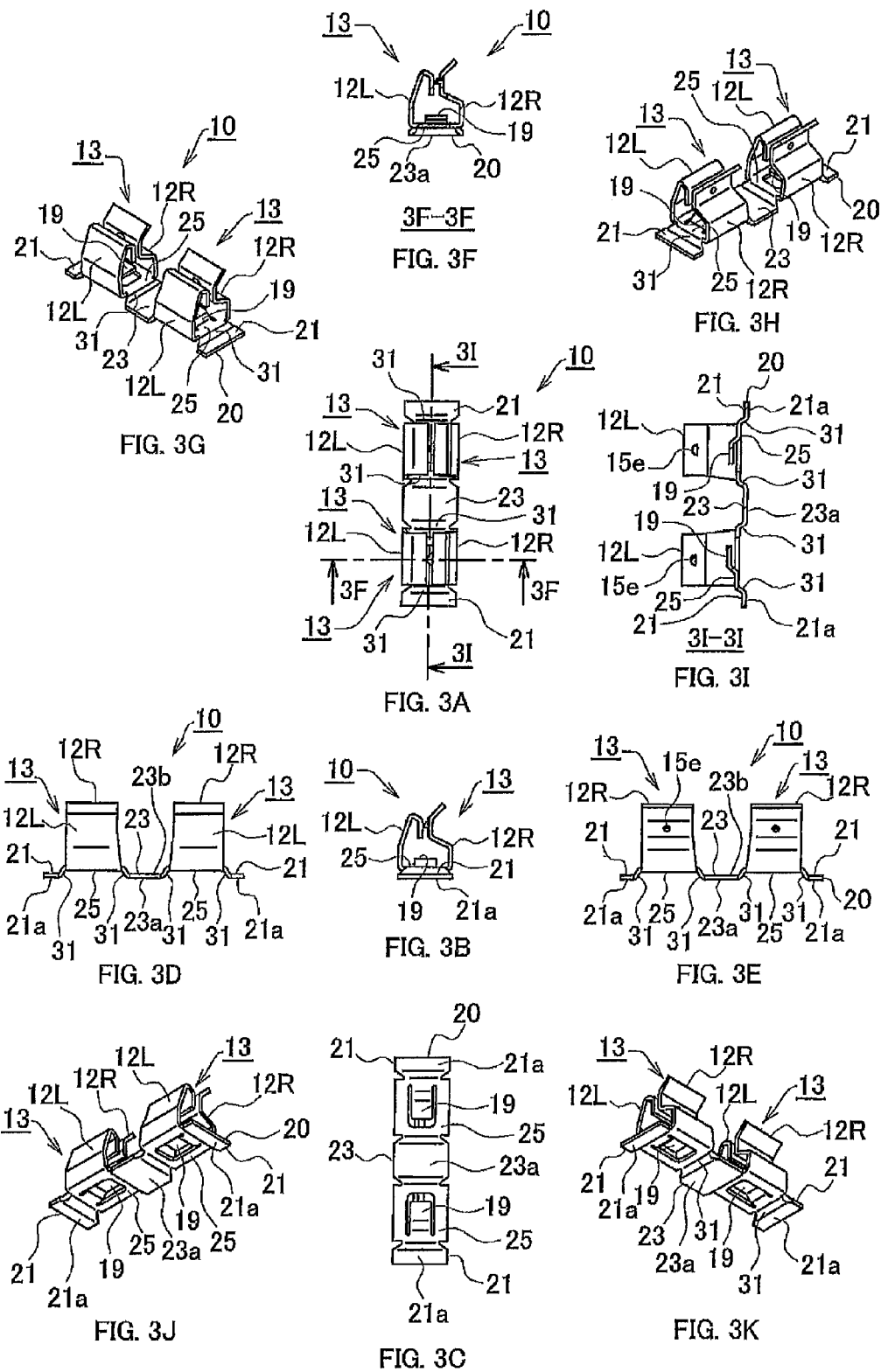

SURFACE MOUNT CLIP

CROSS-REFERENCE TO RELATED APPLICATIONS

This international application claims the benefit of Japanese Patent Application No. 2009-255166 filed Nov. 6, 2009 in the Japan Patent Office, and the entire disclosure of Japanese Patent Application No. 2009-255166 is incorporated herein by reference.

TECHNICAL FIELD

The present invention belongs to a surface mount clip that is to be soldered on a printed circuit board so as to be used, for example, for securing a shielding case.

BACKGROUND ART

Japanese Unexamined Patent Application Publication No. 2005-332953 (Patent Document 1) discloses a surface mount clip which includes clip spring portions provided in a standing manner, in a pair facing each other so as to form a gap therebetween, and which clips a plate material inserted in the gap by a resilient repulsive force.

PRIOR ART DOCUMENTS

Patent Documents

Patent Document 1: Japanese Unexamined Patent Application Publication No. 2005-332953

SUMMARY OF THE INVENTION

Problems to be Solved by the Invention

In a constitution in which a circumferential wall of a shielding case is clipped only by clip springs as in the surface mount clip described in Patent Document 1, there is a concern about an electrical stability. This is because, when the shielding case is inserted, the clip spring portions are deformed to achieve clipping; however, due to such a deformation, contact between the clip spring portions and the shielding case may become unstable.

In order to solve the above problem, there has been provided a surface mount clip which allows easy insertion of a shielding case and provides an improved contact. However, such an improved contact, in other words, an electrical stability, has been desired at a higher level.

In the present invention, it is preferable that a higher level of an electrical stability can be achieved.

Means for Solving the Problems

In a first aspect of the present invention, a surface mount clip includes: a bottom portion having a flat surface; clip spring portions which extend from parts of the bottom portion and are provided in a standing manner, in a pair facing each other so as to form a gap therebetween, and which are configured to clip a plate material inserted into the gap by a resilient repulsive force; and a bottom spring portion which is formed by cutting and raising a part of the bottom portion or the clip spring portions, and which has' an upper surface to be pressed by a lower end of the plate material inserted between the pair of the clip spring portions.

According to the present invention as above, the lower end of the plate material (e.g., a circumferential wall of a shielding case) inserted into the gap between the pair of the clip spring portions, presses the upper surface of the bottom spring portion, thereby resiliently deforming the bottom spring portion. Consequently, it is possible to inhibit separation of the bottom spring portion from the lower end of the plate material (e.g., the circumferential wall of the shielding case) when vibration is applied thereto. That is to say, it is possible to ensure contact and electrical conduction between the bottom spring portion and the lower end of the plate material (e.g., the circumferential wall of the shielding case). As a result, an electrical stability is achieved. Moreover, since the plate material comes into contact with the bottom spring portion, a conduction path between the plate material (e.g., the shielding case) and a printed circuit board is short, thereby leading to low impedance. Therefore, effects of suppressing EMC are improved.

Moreover, the surface mount clip may be formed by bending a thin metal plate member. As "the thin metal plate member" constituting the surface mount clip, it may be preferable to use a plate of metal having a resilient property, such as phosphor bronze. Furthermore, the surface mount clip may include an attachment part to be soldered on the printed circuit board. Solder plating may be applied to the attachment part for the purpose of realizing a preferable soldering.

In the surface mount clip according to a second aspect of the present invention, the bottom portion has at least two flat surfaces. This surface mount clip includes: a raised bottom section located in the bottom portion; and a resilient leg portion which exists between the raised bottom section and the bottom portion adjacent to each other, and which makes the raised bottom section raised from a printed circuit board when the bottom portion is soldered on the printed circuit board.

According to the aforementioned surface mount clip, when the bottom portion is soldered on a printed circuit board, the raised bottom section is raised from the printed circuit board. Therefore, even if a distortion exists in the shielding case or if there is an error in a fixation position of the surface mount clip, the raised bottom section may be deformed in a head-bobbing manner corresponding to such a distortion or an error. Therefore, influences due to a distortion in the shielding case or an error in the fixation position of the surface mount clip can be reduced.

In the surface mount clip according to a third aspect of the present invention, a cut for forming the bottom spring portion reaches from the bottom portion to one of the pair of the clip spring portions, and the bottom spring portion is connected to the one of the pair of the clip spring portions and to the bottom portion.

In the surface mount clip according to the third aspect of the present invention, the bottom spring portion is connected to the one of the pair of the clip spring portions and to the bottom surface. Therefore, when the lower end of the plate material (e.g., the circumferential wall of the shielding case) inserted into the gap between the pair of the clip spring portions presses the upper surface of the bottom spring portion, thereby resiliently deforming the bottom spring portion, a force of moment is caused. The force of moment acts so as to displace the clip spring portion to which the bottom spring portion is connected. Specifically, the one of the clip spring portions is displaced toward an inclining direction toward the other of the pair of the clip spring portions. This increases clipping forces of the clip spring portions against the inserted plate material (e.g., the circumferential wall of the shielding case). Thereby, the holding force for holding the shielding case is improved.

On the other hand, in order to remove the inserted plate material (e.g., the circumferential wall of the shielding case), the clip spring portion, to which the bottom spring portion is connected, is displaced by applying a force thereon, so as to wider a distance from the other of the pair of the clip spring portions. In this case, a force of moment is caused. This force of moment acts such that the bottom spring portion pushes up the lower end of the plate material (e.g., the circumferential wall of the shielding case). Consequently, removal of the plate material (e.g., the circumferential wall of the shielding case) can be facilitated.

In the surface mount clip according to a fourth aspect of the present invention, one of the clip spring portions is provided with a protrusion protruding toward the other of the clip spring portions. Thus, a concave or a hole may be provided at a predetermined position (a position at which the concave or the hole faces the protrusion, while being inserted between the clip spring portions) in the plate material (e.g., the circumferential wall of the shielding case) to be inserted between the clip spring portions. By engaging this hole with the protrusion, holding of the plate material (e.g., the circumferential wall of the shielding case) can be further ensured,

BRIEF DESCRIPTION OF THE DRAWINGS

Hereinafter, embodiments of the present invention will be described with reference to the drawings.

FIGS. 1A-1J are views showing a surface mount clip according to Embodiment 1.

FIGS. 2A-2F are views showing the surface mount clip according to the Embodiment 1 and a shielding case.

FIGS. 3A-3K are views showing a surface mount clip according to Embodiment 2.

EXPLANATION OF REFERENCE NUMERALS

10 . . . surface mount clip, 12L,12R . . . clip spring portion, 13 . . . clip, 15e . . . protrusion, 17 . . . bottom spring portion, 20 . . . base plate, 21 . . . attachment part, 21a . . . undersurface, 23 . . . attachment part, 23a . . . undersurface, 25 . . . raised bottom section, 31 . . . resilient leg portion, C . . . shielding case, H . . . hole, W . . . circumferential wall

MODE FOR CARRYING OUT THE INVENTION

Needless to say, the present invention should not be limited to embodiments described below, but may be practiced in various forms without departing from the gist of the present invention.

Embodiment 1

FIG. 1A is a plan view, FIG. 1B is a front view, FIG. 1C is a bottom view, FIG. 1D is a left side view, FIG. 1E is a right side view, FIG. 1F is a cross-sectional view taken along a line 1F-1F, FIG. 1G is a top-left perspective view, FIG. 1H is a top-right perspective view, FIG. 1I is a bottom-left perspective view, and FIG. 1J is a bottom-right perspective view, respectively, of a surface mount clip according to Embodiment 1.

FIG. 2A is a plan view and FIG. 2B is a cross-sectional view taken along a line 2B-2B, both of which show a state in which a shielding case is closely arranged to the surface mount clip of the Embodiment 1. FIG. 2C is a plan view and FIG. 2D is a cross-sectional view taken along a line 2D-2D, both of which show a state in which a lower end of the shielding case is inserted between clipping portions. FIG. 2E is a plan view and FIG. 2F is a cross-sectional view taken along a line 2F-2F, both of which show a state in which a bottom spring portion is pressed by the lower end of the shielding case.

As shown in FIGS. 1A-1J, a surface mount clip 10 of the present embodiment is provided with two clips 13 each of which is constituted by a pair of clip spring portions 12L and 12R arranged facing each other. Each of the clip spring portions 12L and 12R, and a raised bottom section 25 is a part of a continuous base plate 20. In other words, the clip spring portions 12L and 12R, and the base plate 20 are continuously formed, and one piece of a thin metal plate (phosphor bronze for spring in the present embodiment) is bent to form each of the clip spring portions 12L and 12R, and the base plate 20.

On each of both ends of the base plate 20, an attachment part 21 is provided. Each of the attachment part 21 includes an undersurface 21a. The undersurface 21a is to be used as a soldering surface.

In a central area of the base plate 20, an attachment part 23 is provided. The attachment part 23 includes an undersurface 23a. The undersurface 23a is to be used as a soldering surface.

Also, the attachment part 23 includes a top surface 23b. The top surface 23b is formed to have a size so that when an automatic mounting apparatus (not shown) performs mounting, the top surface 23b can be used as a suction surface to be sucked by a nozzle of the automatic mounting apparatus.

The undersurfaces 21a of the attachment parts 21 and the undersurface 23a of the attachment part 23 have flat surfaces. The surface mount clip 10 is designed such that the undersurfaces 21a and the undersurface 23a together constitute a common flat surface. The raised bottom section 25 provided between the attachment part 21 and the attachment part 23 is connected to the attachment part 21 and the attachment part 23 via resilient leg portions 31. The resilient leg portions 31 are, respectively, raised from the attachment part 21 and the attachment part 23, thereby forming a gap between the raised bottom section 25, and a surface with which the undersurface 21a and the undersurface 23a are to be in contact (a flat surface on which the surface mount clip 10 is to be mounted).

The clip spring portions 12L and 12R have respective base parts which are connected to the raised bottom section 25.

The clip spring portion 12L includes a lower longitudinal part 14a, an inclined part 14b, a guide part 14c, and a clipping part 14d, and is formed in a bent shape. The lower longitudinal part 14a is the base part of the clip spring portion 12L. That is, the lower longitudinal part 14a is connected to the raised bottom section 25. The inclined part 14b is a section, of the clip spring portion 12L, which is inclined from an upper end of the lower longitudinal part 14a in a direction toward the clip spring portion 12R. The guide part 14c is a section, of the clip spring portion 12L, which is downwardly-inclined in a U-shaped manner from an upper end of the inclined part 14b. The clipping part 14d is a section, of the clip spring portion 12L, which hangs down from a lower end of the guide part 14c.

The clip spring portion 12R includes a lower longitudinal part 15a, an inclined part 15b, a clipping part 15c, and a guide part 15d. The lower longitudinal part 15a is the base part of the clip spring portion 12R. That is, the lower longitudinal part 15a is connected to the raised bottom section 25. The inclined part 15b is a section, of the clip spring portion 12R, which is inclined from an upper end of the lower longitudinal part 15a in an obliquely-upward direction in such a manner to approach the clip spring portion 12L. The clipping part 15c is a section, of the clip spring portion 12R, which extends upwardly from an upper end of the inclined part 15b. The guide part 15d is a section, of the clip spring portion 12R, which is inclined from an upper end of the clipping part 15c in an obliquely-upward direction in such a manner to be away from the clip spring portion 12L.

The clipping part 15c is provided with a protrusion 15e protruding toward the clipping part 14d.

A tip end of the protrusion 15e is in contact with the clipping part 14d. The surface mount clip 10 is designed such that, in the above contacted state of the tip end of the protrusion 15e and the clipping part 14d, the clipping part 14d and the clipping part 15c are parallel to each other.

Moreover, a part of the raised bottom section 25 is cut and raised to form a bottom spring portion 17. A cut for forming the bottom spring portion 17 reaches from the raised bottom section 25 to the lower longitudinal part 15a of the clip spring portion 12R, and therefore, the bottom spring portion 17 is connected to the clip spring portion 12R.

A tip end of the bottom spring portion 17 is located at a position at which if the clipping part 14d and the clipping part 15c are imaginarily extended downward, the tip end of the bottom spring portion 17 intersects with such imaginary-extended planes. By this configuration, a lower end of a plate material inserted between the clipping part 14d and the clipping part 15c is to abut against an upper surface of the bottom spring portion 17. Moreover, since the tip end of the bottom spring portion 17 is located at a position higher than a position of the raised bottom section 25, the bottom spring portion 17 is pressed by the lower end of the plate material inserted between the clipping part 14d and the clipping part 15c. Consequently, the bottom spring portion 17 can be resiliently deformed downward toward the raised bottom section 25.

The surface mount clip 10 is used by soldering the undersurfaces 21a of the attachment parts 21 and the undersurface 23a of the attachment part 23, on a printed circuit board. For example, as illustrated in FIGS. 2A-2F, two pieces of the surface mount clips 10 may be arranged in parallel to each other. Alternatively, the surface mount clips 10 may be provided in rectangular arrangements (not shown). By clipping a circumferential wall W of a shielding case C between the clip spring portions 12L and 12R of the surface mount clip 10, the shielding case C can be fixed by the surface mount clip 10.

A position of the shielding case C is adjusted so that the circumferential wall W of the shielding case C can be clipped between the guide part 14c and the guide part 15d (see FIGS. 2A and 2B). Specifically, the circumferential wall W is inserted between the clipping part 14d and the clipping part 15c (see FIGS. 2C and 2D). Then, the entire shielding case C is further lowered.

Thereafter, a lower end of the circumferential wall W presses the bottom spring portion 17. By this pressing, the bottom spring portion 17 is resiliently deformed downward toward the raised bottom section 25. The shielding case C is continuously lowered until a hole H provided in the circumferential wall W comes to engage with the protrusion 15e (see FIGS. 2E and 2F). When the hole H and the protrusion 15e are caused to be engaged with each other, a "clicking" sensation can be felt. Thus, the shielding case C can be stopped at an appropriate press-in position. Furthermore, in a state where the hole H and the protrusion 15e are engaged with each other, a resilient repulsive force of the bottom spring portion 17 acts as a force which pushes up the circumferential wall W upwardly. Consequently, a highly excellent holding force for holding the shielding case C can be achieved, thereby making it possible to obtain a further ensured electrical conduction.

As explained above, the lower end of the circumferential wall W of the shielding case C inserted between the pair of the clip spring portions 12L and 12R presses the upper surface of the bottom spring portion 17, thereby resiliently deforming the bottom spring portion 17. Thus, even when at least one of the surface mount clip 10 and the shielding case C is vibrated, it is possible to inhibit separation of the bottom spring portion 17 from the lower end of the circumferential wall W of the shielding case C. That is to say, it is possible to ensure contact and electrical conduction between the bottom spring portion 17 and the lower end of the circumferential wall W of the shielding case C. Consequently, an electrical stability can be ensured.

Specifically, in the state where the hole H and the protrusion 15e are engaged with each other, a resilient repulsive force of the bottom spring portion 17 acts as a force which pushes up the circumferential wall W. Consequently, a highly excellent holding force for holding the shielding case C can be achieved, thereby making it possible to obtain a further ensured electrical conduction. Moreover, the protrusion 15e may have a convex shape which is a semi-circular shape. Alternatively, the protrusion 15e may have a quarter-circular shape so that an acute-angle portion can be formed. If the protrusion 15e and the hole H are configured to engage with each other with the acute-angle portion formed on the protrusion 15e, effects of the present invention can be further enhanced.

Moreover, since contact between the shielding case C and the bottom spring portion 17 is achieved, a conduction path between the shielding case C and a printed circuit board (not shown) is short, thereby leading to low impedance. Therefore, effects of suppressing EMC are improved. Specifically, it is possible to inhibit a noise from occurring.

Furthermore, the cut for forming the bottom spring portion 17 reaches from the raised bottom section 25 to the lower longitudinal part 15a of the clip spring portion 12R, and therefore, the bottom spring portion 17 is connected to the clip spring portion 12R. Thus, when the lower end of the circumferential wall W of the shielding case C inserted between the pair of the clip spring portions 12L and 12R presses the upper surface of the bottom spring portion 17, thereby resiliently deforming the bottom spring portion 17, a force of moment is caused. The force of moment acts so as to displace the clip spring portion 12R to which the bottom spring portion 17 is connected. Specifically, the clip spring portion 12R is displaced toward an inclining direction toward the clip spring portion 12L which is the other of the pair. This increases clipping forces of the clip spring portions 12L and 12R against the inserted circumferential wall W of the shielding case C. Thereby, the holding force for holding the shielding case C is improved. Also, if an article to which the present invention is applied is used on each of opposing faces of the shielding case C, the holding force for holding the shielding case C is further enhanced.

On the other hand, in order to remove the inserted circumferential wall W of the shielding case C, the clip spring portion 12R, to which the bottom spring portion 17 is connected, is displaced by applying a force on the guide part 15d of the clip spring portion 12R, so as to wider a distance from the other of the pair. In this case, a force of moment is caused. This force of moment acts such that the bottom spring portion 17 pushes up the lower end of the circumferential wall W of the shielding case C. In this case, removal of the shielding case C can be facilitated.

Moreover, the bottom spring portion 17 is formed by cutting and raising the part of the raised bottom section 25, and therefore, is not to be directly soldered on a printed circuit board. Thus, solder crack due to resilient deformation of the bottom spring portion 17 can be inhibited from occurring.

Embodiment 2

FIG. 3A is a plan view, FIG. 3B is a front view, FIG. 3C is a bottom view, FIG. 3D is a left side view, FIG. 3E is a right side view, FIG. 3F is a cross-sectional view taken along a line 3F-3F, FIG. 3G is a top-left perspective view, FIG. 3H is a top-right perspective view, FIG. 3I is a cross-sectional view taken along a line 3I-3I, FIG. 3J is a bottom-left perspective view, and FIG. 3K is a bottom-right perspective view, respectively, of a surface mount clip according to Embodiment 2.

In the Embodiment 1, the bottom spring portion 17 is extended in a width direction of the base plate 20; however, the bottom spring portion 17 may be extended along a longitudinal direction of the base plate 20 as shown in FIGS. 3A-3K. In this configuration as well, effects obtained by a resilient repulsive force of the bottom spring portion 17 are the same as those in the Embodiment 1. However, since the bottom spring portion 17 is not connected to the clip spring portion 12R (or 12L), the effects obtained when the bottom spring portion 17 is connected to the clip spring portion 12R (or 12L) cannot be realized.

[Others]

Although detailed explanations are not provided here, the surface mount clip 10 according to each of the Embodiments 1 and 2 has the same configuration as a configuration of the surface mount clip described in Patent Document 1. Accordingly, the surface mount clip 10 according to each of the Embodiments 1 and 2 can realize the same effects as those obtained by the surface mount clip described in Patent Document 1 within a range of effects attributed to the same configuration.

Moreover, in the Embodiments 1 and 2, the attachment parts are provided at three positions and the raised bottom sections are provided at two positions (i.e., two pairs of the clip spring portions are provided). However, it should not be limited to the aforementioned combination of numbers of 3 to 2; needless to say, the combination of numbers can be 2 to 1, 4 to 3, 5 to 4, etc.

Furthermore, in the Embodiments 1 and 2, the base plate 20 is bent in a waved manner to form the attachment parts 21, the attachment part 23, the raised bottom sections 25, and the resilient leg portions 31. However, the base plate 20 may have a flat surface. In this case, the effects obtained by providing the raised bottom sections 25 are not realized; however, other than such effects, the same effects as those in the Embodiments 1 and 2 can be realized.

The invention claimed is:

1. A surface mount clip comprising:
a bottom portion having a flat surface;
a pair of clip spring portions which extend from the bottom portion and are provided in an upstanding manner and the pair of clip spring portions facing each other so as to form a gap therebetween, and the pair of clip spring portions being configured to clip a plate material inserted into the gap by a resilient clamping force;
a bottom spring portion being cut from the bottom portion and a first one of the pair of clip spring portions to form a cut, the bottom spring portion having one edge supported by and continuous with the first one of the pair of clip spring portions, and
the cut being located between the bottom spring portion and the bottom portion, and the cut also being located between a portion of the first one of the pair of clip spring portions and the bottom spring portion, the bottom spring portion comprising:
a plate-like portion which is separated and spaced from the bottom portion by the cut and projects away from the bottom portion toward the gap;
the plate-like portion, when the plate material is not inserted into the gap and the plate-like portion is not pressed by the plate material, extends parallel to the bottom portion; and
each of the pair of clip spring portions having a guide part for receiving the plate material, and the guide part of one of the pair of clip spring portions and the guide part of the other of the pair of clip spring portions having different shapes from one another.

2. The surface mount clip according to claim 1, wherein the bottom portion has at least two flat surfaces, and the surface mount clip further comprises:
a raised bottom section located in the bottom portion; and
a resilient leg portion which exists between the raised bottom section and the bottom portion adjacent to each other, and which makes the raised bottom section raised from a printed circuit board when the bottom portion is soldered on the printed circuit board.

3. The surface mount clip according to claim 1, wherein the cut for forming the bottom spring portion reaches from the bottom portion to the first one of the pair of clip spring portions, and the bottom spring portion is connected to the first one of the pair of clip spring portions.

4. The surface mount clip according to claim 1, wherein one of the pair of clip spring portions is provided with a protrusion protruding toward the other of the pair of clip spring portions.

5. The surface mount clip according to claim 1, wherein the surface mount clip is formed by bending a thin metal plate member.

6. The surface mount clip according to claim 2, wherein solder plating is applied to the at least two flat surfaces.

7. The surface mount clip according to claim 1, wherein only a single bottom spring portion is provided for each pair of clip spring portions.

8. The surface mount clip according to claim 1, wherein the cut, which forms the bottom spring portion, extends over a majority of one of a length or a width of the bottom portion.

9. The surface mount clip according to claim 1, wherein a substantially circular protrusion extends from a vertically extending section of a first one of the pair of clip spring portions and protrudes normal to an adjacent surface of the first one of the pair of clip spring portions toward the other of the pair of clip spring portions.

10. A surface mount clip comprising:
a bottom portion having a flat surface;
a pair of clip spring portions which extend from the bottom portion and arranged in an upstanding manner as R an the pair of clip spring portions facing each other so as to form a gap therebetween, and the pair of clip spring portions being configured to clip a plate material inserted into the gap by a resilient repulsive force;
a bottom spring portion being cut from the bottom portion to form a cut, a portion of the bottom spring portion being separated and spaced from the bottom portion by the cut and raised with respect to the bottom portion toward the gap so as to form an opening beneath the bottom spring portion, and the bottom spring portion having an upper surface which is located to engage with and be pressed by a lower end of the plate material, toward the bottom portion, when the plate material is inserted between the pair of dip spring portions;

the cut being located between the bottom spring portion and the bottom portion, and the cut also being located between a portion of the first one of the pair of clip spring portions and the bottom spring portion;

the upper surface of the bottom spring portion, when the plate material is not inserted into the gap and the upper surface is not pressed by the plate material, is raised and extends parallel to the bottom portion; and each of the pair of clip spring portions having a guide part for receiving the plate material, and the guide part of one of the pair of clip spring portions and the guide part of the other of the pair of clip spring portions having different shapes from one another.

11. A surface mount clip comprising:

a bottom portion having a flat surface;

a pair of clip spring portions which extend from the bottom portion and are provided in an upstanding manner;

the pair of clip spring portions facing each other so as to form a gap therebetween;

the pair of clip spring portions being configured to clip a plate material inserted into the gap by a resilient clamping force;

a bottom spring portion being cut from the bottom portion to form a cut, at least a portion of the bottom spring portion extending upward from the bottom portion so as to form an opening in the bottom portion which is located beneath the bottom spring portion, and the bottom spring portion being supported by the bottom portion only along one edge so as to be bendable toward the bottom portion when the plate material is inserted into the gap and engages with the bottom spring portion;

the cut being located between the bottom spring portion and the bottom portion, and the cut also being located between a portion of the first one of the pair of clip spring portions and the bottom spring portion, an area of the bottom spring portion is arranged to contact the plate material when the plate material is received with the gap;

the area of the bottom spring portion, when the plate material is not inserted into the gap and the area of the bottom spring portion is not pressed by the plate material, extends parallel to the bottom portion; and each of the pair of clip spring portions having a guide part for receiving the plate material, and the guide part of one of the pair of clip spring portions and the guide part of the other of the pair of clip spring portions having different shapes from one another.

12. The surface mount clip according to claim 1, wherein, when the plate material is inserted between the pair of the clip spring portions, the plate-like portion is biased, by a lower end of the plate material, toward the bottom portion.

13. The surface mount clip according to claim 1, wherein only a single edge of the bottom spring portion is supported by and continuous with the first one of the pair of clip spring portions so as to facilitate bending of the bottom spring portion toward the bottom portion when the plate material inserted into the gap and engages with the bottom spring portion.

14. The surface mount clip according to claim 1, wherein the bottom spring portion bends toward the bottom portion only about the one edge supported by and continuous with the first one of the pair of clip spring portions.

15. The surface mount clip according to claim 1, wherein the plate-like portion is supported in a cantilevered fashion.

16. The surface mount clip according to claim 1, wherein the bottom portion further comprises:

a lower bottom section for engaging with a printed circuit board;

a raised bottom section, and a resilient leg portion connecting the lower bottom section with the raised bottom section so that the raised bottom section is elevated from the printed circuit board when the lower bottom section is soldered on the printed circuit board; and the bottom spring portion being cut from and extends upwardly from the raised bottom section.

* * * * *